US008614635B2

United States Patent
Hode

(10) Patent No.: US 8,614,635 B2
(45) Date of Patent: Dec. 24, 2013

(54) METHOD FOR CORRECTING AMPLITUDE AND PHASE OFFSETS IN A SIGMA-DELTA MODULATOR AND SIGMA-DELTA MODULATOR IMPLEMENTING SAID METHOD

(75) Inventor: Jean-Michel Hode, St Cloud (FR)

(73) Assignee: Thales, Neuilly sur Seine (FR)

( * ) Notice: Subject to any disclaimer, the term of this patent is extended or adjusted under 35 U.S.C. 154(b) by 19 days.

(21) Appl. No.: 13/127,041

(22) PCT Filed: Oct. 29, 2009

(86) PCT No.: PCT/EP2009/064322
§ 371 (c)(1),
(2), (4) Date: Oct. 3, 2011

(87) PCT Pub. No.: WO2010/049505
PCT Pub. Date: May 6, 2010

(65) Prior Publication Data
US 2012/0032825 A1 Feb. 9, 2012

(30) Foreign Application Priority Data

Oct. 31, 2008 (FR) ..................................... 08 06077

(51) Int. Cl.
*H03M 1/06* (2006.01)
(52) U.S. Cl.
USPC .......................... 341/118; 341/143

(58) Field of Classification Search
USPC .................. 341/110, 118, 120, 143, 144, 155
See application file for complete search history.

(56) References Cited

U.S. PATENT DOCUMENTS

| 6,473,013 | B1 * | 10/2002 | Velazquez et al. ............ 341/120 |
| 6,970,120 | B1 | 11/2005 | Bjornsen |
| 7,193,546 | B1 | 3/2007 | Melanson |
| 7,315,269 | B2 * | 1/2008 | Schreier et al. ............... 341/143 |
| 8,171,335 | B2 * | 5/2012 | Tsai .............................. 713/503 |
| 2003/0146862 | A1 | 8/2003 | Gandolfi et al. |
| 2007/0035426 | A1 | 2/2007 | Schreier et al. |
| 2010/0066422 | A1 * | 3/2010 | Tsai .............................. 327/163 |
| 2012/0074995 | A1 * | 3/2012 | Zhang ........................... 327/156 |

* cited by examiner

*Primary Examiner* — Peguy Jean Pierre
(74) *Attorney, Agent, or Firm* — Baker Hostetler LLP

(57) ABSTRACT

In a method for correcting amplitude and phase offsets in a sigma-delta modulator having a loop including an integrator with a filter and an amplifier, an analog-to-digital converter, a digital-to-analog converter, and an adder-subtractor, an open-loop amplitude/phase frequency response of the modulator is estimated digitally. A phase offset value and an amplitude offset value are calculated by comparing the estimated open-loop amplitude/phase response with a reference amplitude/phase frequency response. The phase and gain offsets of the loop are then compensated for according to the estimated offset values. A sigma-delta modulator implements the method.

9 Claims, 3 Drawing Sheets

METHOD FOR CORRECTING AMPLITUDE AND PHASE OFFSETS IN A SIGMA-DELTA MODULATOR AND SIGMA-DELTA MODULATOR IMPLEMENTING SAID METHOD

CROSS-REFERENCE TO RELATED APPLICATIONS

This application is a National Stage of International patent application PCT/EP2009/064322, filed on Oct. 29, 2009, which claims priority to foreign French patent application No. FR 08 06077, filed on Oct. 31, 2008, the disclosures of which are incorporated by reference in their entirety.

FIELD OF THE INVENTION

The present invention relates to a method for correcting amplitude and phase offsets in a sigma-delta modulator and a modulator implementing the method. It applies notably to the field of signal processing and electronics.

BACKGROUND OF THE INVENTION

The conversion of an analog signal into a digital signal has become a conventional operation in present-day electronic circuits, by virtue of standard commercially available components generally grouped together under the acronym ADC, for "Analog-to-Digital Converter". A signal e(t) is represented, varying continuously in time and able to take any value in a form s(t) sampled in time. Each sample can take a finite number of possible quantized values and each value is encoded on a well defined number of bits. Each bit can take only two possible values, 1 or 0 for example.

Conventional ADCs provide precision levels that are satisfactory at relatively low input signal frequencies, of the order of a few tens or even hundreds of megahertz. This means that at these frequencies, the difference between the signal represented digitally at the output and the analog input signal is acceptable. But in the field of microwave frequencies, when the frequency of the input signal is of the order of a few gigahertz, the dynamics of conventional ADCs, i.e. their capability to sample/quantize the input signal both rapidly and accurately turns out to be markedly inadequate. First of all, this is due to the inadequate rise time of an internal component of ADCs called the sample/hold circuit. It may be difficult for a sample/hold circuit to stabilize an input signal with a view to quantizing it if it is at too high a frequency, the duration required for this stabilization hence being too long with respect to the sampling period. This introduces errors, i.e. digital samples can be unrepresentative of the analog signal. Each sample can then be encoded only on a reduced number of amplitude values. This intrinsically generates an error due to the lack of precision before the quantization of the amplitude of each sample. Consequently, the error inherent to the digitization method of a conventional ADC at high sampling frequency is the sum of the error described, related to the rapidity defect of the sample/hold circuit, and of the quantization rounding error which reflects the difference between the signal thus sampled/held and its quantized digital representation. This overall error is incorrectly referred to as "quantization noise" since, in practice, the part related to the quantization is in the majority (at least at low frequency). Thus, at high frequency, the difference between the signal represented digitally at the output and the analog signal at the input becomes non-negligible and the precision of the ADC is no longer satisfactory. In summary, the precision of conventional ADCs decreases when the frequency of the analog signal e(t) applied at their input increases. They are therefore not suitable for use in very high-frequency applications demanding good digital precision, such as radars for example.

A method called sigma-delta modulation provides for improving the precision of an ADC locally around a frequency, if necessary around a high frequency. The basic principle is to make the digital output signal vary arbitrarily, or to "modulate" it, so as to minimize the error for any spectral component contained in the relevant band (which depends on the use), even if it means that samples of the digital output signal can appear unrepresentative of the analog input signal. To this end, sigma-delta modulation requires by principle that the signal be strongly oversampled, which can be done only on a small number of bits. This amounts to improving the time-domain precision by cutting the signal into a large number of samples but, as explained earlier, at the cost of a reduction in amplitude precision due to the increase in sampling frequency. However, by relying on oversampling, the digital output signal can be modulated in order to minimize the power of this quantization noise in a defined frequency band.

In the frequency or spectral domain, it is commonly said that sigma-delta modulation makes the quantization noise "compliant". This is because, the modulation of the digital output signal, which is adapted to the frequency of the input signal, amounts to minimizing the spectral density of the quantization noise around the frequency of the useful signal. In fact, the spectrum of the quantization noise must be made "compliant" with an ideal spectrum presenting a trough near the frequency of use. Thus, even if an overall significant quantization noise is intrinsically generated in sigma-delta modulation, and this regardless of the frequency of the signal at the input, at least this quantization noise is of low power close to the frequency of use.

A sigma-delta modulator can be implemented from an ADC converter controlled conventionally in a feedback loop, with a view to lessening the effect of its quantization noise on its digital output. In this case, a digital-to-analog converter, hereafter referred to as DAC converter, provides for converting the digital output signal from the ADC converter back to analog with a view to subtracting it from the input signal, through the principle of closed loop control. An amplifier and a loop filter are used to circumvent the drawback of conventional ADCs by combining high frequency and fine resolution.

During the design of such a modulator, it is necessary to adjust the loop in order to ensure that its frequency response enables stable operation. The stability of the loop is characterized in the frequency domain by an examination of the complex open-loop response, the response having to meet the Nyquist criterion. To this end, it is necessary to have available a digital network analyzer in order to carry out this measurement, then to transfer this measurement to a display device.

Following this initial adjustment, frequency, phase and amplitude drifts appear notably due to ageing of components of the modulator and temperature variations. These drifts are referred to as "offsets" hereafter in the description. For example, if a variation in the loop delay involves a phase offset between $-\pi$ and $\pi$ in the loop bandwidth, it is probable that the modulator has become unstable. On the other hand, the passage of the gain through 0 dB must take place at frequencies at which the phase margin is maximum.

It is imperative during operation to compensate regularly for these offsets.

SUMMARY OF THE INVENTION

One aim of the invention is notably to overcome the above-mentioned drawbacks.

To this end, the invention relates to a method for correcting amplitude and phase offsets in a sigma-delta modulator comprising a loop including at least an integrator composed of a filter and an amplifier, an analog-to-digital converter ADC, a digital-to-analog converter DAC and an adder-subtractor. The modulator open-loop amplitude/phase frequency response is estimated digitally and a phase offset value $\Delta\phi$ and an amplitude offset value $\Delta\rho$ are calculated by comparing the estimated open-loop amplitude/phase response with a reference amplitude/phase frequency response. The phase and gain offsets of the loop are then compensated for according to the estimated offset values.

According to one aspect of the invention, the loop amplifier is a variable gain amplifier.

The gain compensation is, for example, carried out by controlling the variable gain amplifier using a command representative of the current estimated gain offset value.

The gain compensation can also be carried out by a feedback with integration of error over a defined duration on the gain offset values estimated during this period in order to control the variable gain amplifier.

According to another aspect of the invention, the loop comprises a variable attenuator and the gain compensation is carried out by controlling said attenuator using an attenuation command representative of the current estimated gain offset value.

The phase compensation is carried out, for example, by controlling the phase shift between the clock signals of the ADC and DAC converters of the loop using at least one command representative of the current estimated phase offset value.

The phase compensation is carried out, for example, by a feedback with integration of error over a defined duration on the phase offset values estimated during this period so as to generate at least one command for controlling the phase shift between the clock signals of the ADC and DAC converters of the loop.

The invention also relates to a sigma-delta modulator for converting an analog signal e(t) into a digital signal s(t). The modulator comprises a loop including at least an integrator composed of a filter and an amplifier, an analog-to-digital converter ADC, a digital-to-analog converter DAC and an adder-subtractor, characterized in that it implements the method as claimed in one of the preceding claims and in that it includes means for estimating the modulator open-loop amplitude/phase frequency response. It also comprises means for calculating the phase and amplitude offsets by comparing the estimated amplitude/phase frequency response with a reference amplitude/phase frequency response. It also comprises means for compensating for the calculated amplitude offsets and means for compensating for the calculated phase offsets by controlling the phase shift between the clock signals of the ADC and DAC converters.

According to one implementation, the modulator open-loop amplitude/phase frequency response measurement operations and the phase and amplitude offset calculation are carried out by an FPGA type programmable logic device.

BRIEF DESCRIPTION OF THE DRAWINGS

Other features and advantages of the invention will become apparent from the following description given by way of illustration and in a non-limiting manner, with reference to the accompanying drawings in which.

DETAILED DESCRIPTION

Figure 1:
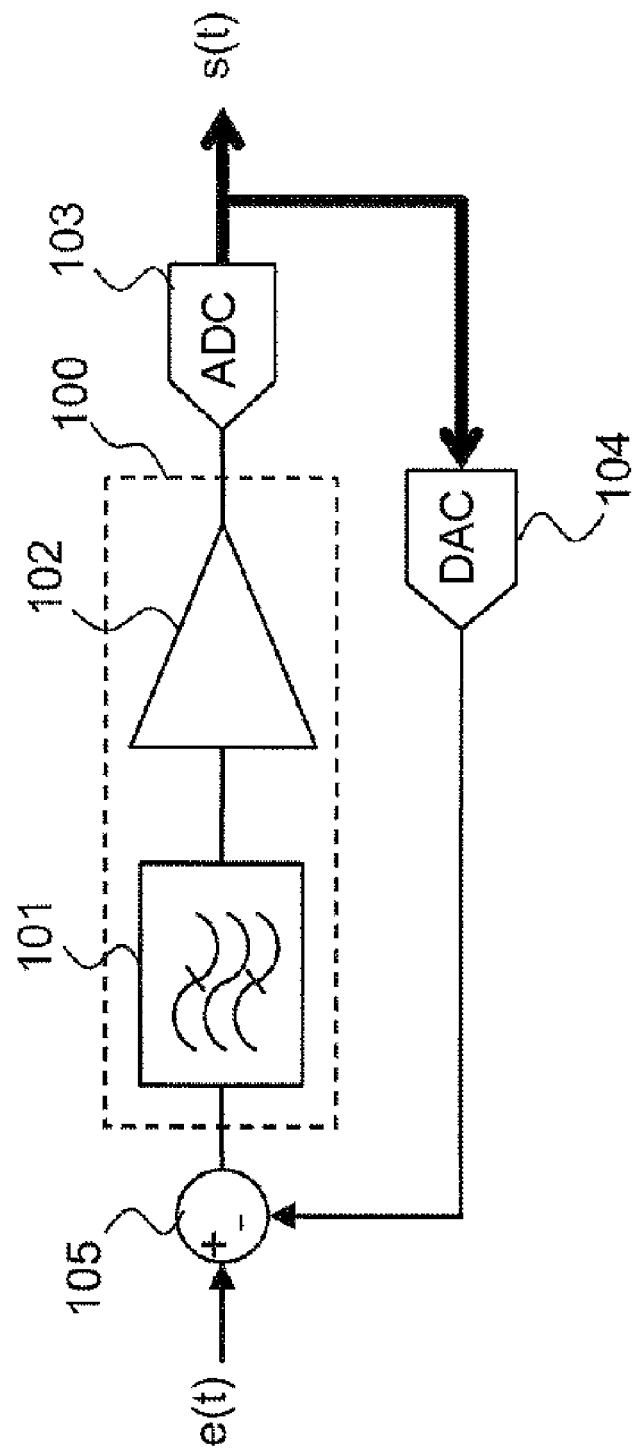
FIG. 1 presents an example continuous-time sigma-delta modulator.

FIG. 1 presents an example sigma-delta modulator. As explained previously, the role of a continuous-time sigma-delta modulator is two-fold. A first role is to sample and digitize at high sampling frequency an analog signal e(t) with a small number of bits, i.e. less than the theoretical number required to reach a given signal-to-noise ratio. A second role is to shape the quantization noise so that the spectral density of this noise in the useful band of the signal to be converted is compatible with the signal-to-noise ratio aimed at after decimation. To this end, a continuous-time bandpass sigma-delta modulator is comparable to a feedback loop. An integrator 100 itself composed of a bandpass filter 101 and an amplifier 102 has the role of integrating and amplifying the error in the useful band of the signal. The loop comprises an ADC converter 103 producing the output s(t) of the modulator. The output s(t), i.e. the encoded signal, is then looped back to a DAC converter 104. An adder-subtractor 105 for evaluating the difference between the input signal and the encoded signal is placed at the input of the modulator. The signal is digital between the output of the ADC converter 103 and the input of the DAC converter 104.

Figure 2:
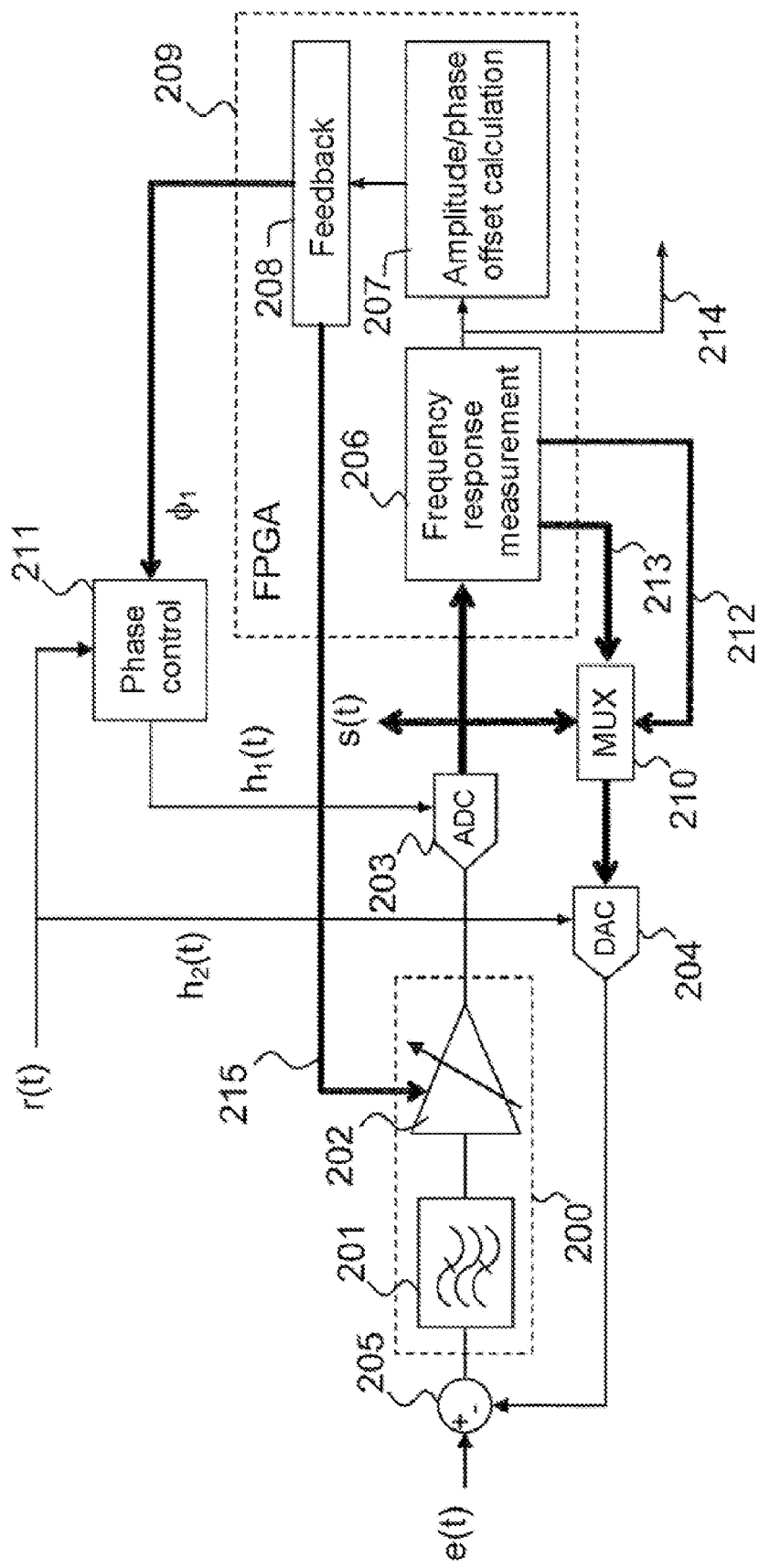
FIG. 2 presents a first variant of a sigma-delta modulator implementing the method according to the invention.

FIG. 2 presents a first variant of a sigma-delta modulator implementing the method according to the invention. The main items composing a conventional sigma-delta modulator as described with the aid of FIG. 1 are used, i.e. an integrator 200 comprising a filter 201 and an amplifier 202, an ADC converter 203, a DAC converter 204 and an adder-subtractor 205. The loop takes at the input of the adder-subtractor 205 the signal e(t) to be modulated. The output of the loop corresponds to the signal s(t) available at the output of the ADC converter 203.

An aim of the method according to invention is to compensate for the phase and amplitude offsets during the operation of the modulator. To this end, the modulator open-loop frequency response is estimated. By principle, the opening of the open loop is carried out just after the loop output, i.e. at the input of the loop return DAC converter 204 where a signal is injected 213, and the frequency response is measured 206 by observing the resulting signal s(t). The opening of the loop of the modulator is carried out, for example, with the aid of a static multiplexer 210. The latter has only a very limited impact on the loop latency. Specifically, the additional delay introduced is equivalent to the propagation time in a logic gate. The measurement of the frequency response is conducted by a measurement module 206. The latter is responsible, for example, for triggering the measurement, for opening the loop and for the actual measurement. To this end, the multiplexer 210 is controlled by a command signal 212. The measurement of the response can be triggered according to a criterion, for example, a time counter allows the module to know at which moment the last measurement was carried out. If this measurement was carried out beyond a certain threshold defining the minimum time gap between two successive measurements, a measurement is triggered as soon as the modulator is inactive. Indeed, it is necessary that the modulator does not need to be used at the moment of the measurement since the loop of the modulator must be open. The result of the measurement can be directed to the modulator output 214 in order, for example, to display the estimated frequency response.

Once the loop frequency response is measured, the latter is used to calculate 207 the amplitude and phase offset of the response. To this end, it is possible notably to calculate the difference with respect to a reference response acquired during the tuning of the modulator. The main distortions of this reference response are, as explained previously, the frequency offset on the one hand, and a variation in delay and in amplitude gain on the other hand. The frequency offset cannot be compensated for but can be determined by estimating the amplitude peak average position variation, which can be expressed using, for example, the following formula:

$$\Delta n = \left(\frac{\sum_n n \cdot \rho_n^2}{\sum_n \rho_n^2}\right)_{measured} - \left(\frac{\sum_n n \cdot \rho_n^2}{\sum_n \rho_n^2}\right)_{reference} \quad (1)$$

The index n corresponds to the sampling index of the frequency response and $\rho_n$ to the modulus of the response at the $n^{th}$ frequency index.

Once this offset is known, it is possible to interpolate the reference frequency response in order to obtain the corresponding values of modulus and phase, i.e.

$\rho_{n+\Delta n}^{(ref)}$ and $\phi_{n+\Delta n}^{(ref)}$.

The additional linear gain to be applied $\Delta\rho$ for the compensation of the amplitude offset can then be calculated using formulae from various least squares formalisms corresponding to various weightings of sporadic errors on the amplitude in the average error.

By way of example, the formulae (2) or (3) can be used.

For a uniform weighting of errors, the following expression can be used:

$$\Delta\rho = \frac{\sum_n \rho_n \cdot \rho_{n+\Delta n}^{(ref)}}{\sum_n \rho_n^2} \quad (2)$$

For a weighting of errors by $1/(\rho_{n+\Delta n}^{(ref)})^2$, the following expression can be used:

$$\Delta\rho = \frac{\sum_n \left(\rho_n / \rho_{n+\Delta n}^{(ref)}\right)^2}{\sum_n \rho_n / \rho_{n+\Delta n}^{(ref)}} \quad (3)$$

In the same way, the phase difference $\Delta\phi$ allowing the compensation of the phase offset can then be calculated using formulae from least squares formalisms corresponding to various weightings of sporadic errors on the amplitude in the average error.

For example, the formulae (4) or (5) can be employed.

For a uniform weighting in the band, the following formula can be used:

$$\Delta\phi = 2\pi f_0 \Delta\tau = \left\langle \phi_n - \phi_{n+\Delta n}^{(ref)} \right\rangle \quad (4)$$

where < > denotes the average value in the band.

For a weighting proportional to the difference at the centre of the band, the following formula can be used:

$$\Delta\phi = 2\pi f_0 \Delta\tau = \frac{-\sum_n (n-n_0)^2 \cdot \left(\phi_n - \phi_{n+\Delta n}^{(ref)}\right)}{\sum_n (n-n_0)^2} \quad (5)$$

formulae in which $\phi_n$ is the phase of the response at the frequency of index n and $f_0$ the corresponding frequency at the index $n_0$ defined by:

$$n_0 = \frac{\sum_n n \rho_n^2}{\sum_n \rho_n^2} \quad (6)$$

These calculations can be conducted by being restricted to the useful band, which avoids, in particular, dealing with the problem of phase aliasing.

The amplitude and phase correction to be applied can arise only from a simple unitary correction calculation from the estimates $\Delta\rho$ and $\Delta\tau$ of the amplitude and phase offsets with respect to a reference, or it can be the conclusion of a true feedback process 208 with integration of error over a determined duration.

The amplitude offset of the loop can thus be corrected by applying, for example, a command voltage 215 to the amplifier 202, when the latter is, for example, a variable gain amplifier 202, this voltage being a function of the amplitude error to be compensated for. In place of a variable gain amplifier, it is also possible to use a fixed gain amplifier completed by a variable attenuator. In this case it is the attenuator which will be commanded in order to compensate for the amplitude offset. Since the compensation command is generally digital, due to the fact that the measurement of the response and the calculation of the offset are carried out digitally, a DAC converter can then be required if the control of the gain or attenuation is analog. If the variable gain amplifier 202 can be controlled digitally, this converter is then not required.

Similarly, the amplitude offset can be carried out with the aid of a variable attenuator, the command of which can be digital or analog. In the latter case, a DAC will then be required to generate this voltage from a digital command.

The phase offset of the loop can be corrected by adjusting the relative phase between the clock signals $h_1(t)$ and $h_2(t)$ of the two converters ADC 203 and DAC 204 of the loop. To this end, a reference signal r(t), for example a sinusoid of frequency $f_{REF}$ equal to the sampling frequency of the loop, i.e. $f_{REF}=f_e$, is used as the basis for the generation of the clock signals $h_1(t)$ and $h_2(t)$. The signal r(t) is, for example, directly used as the clock for the DAC converter 204, i.e. $h_2(t)=r(t)$. The relative phase between the two clocks is controlled 211 by adjusting the phase of the clock signal $h_1(t)$. To this end, it is possible to use a phase-lock loop, a method known to a person skilled in the art and allowing the phase of the clock signal to be adjusted taking into account a digital phase-control command $\phi_1$ presented at its input. It is also possible to control the phase of the clock signal with the aid of digital phase shift devices, or "phase shifters".

The functional modules carrying out the measurement of the frequency response 206, the calculation of the amplitude/phase offset 207 and the calculation of gain and phase commands by feedback 208 can be, for example, implemented within an FPGA type programmable logic device 209.

Figure 3:
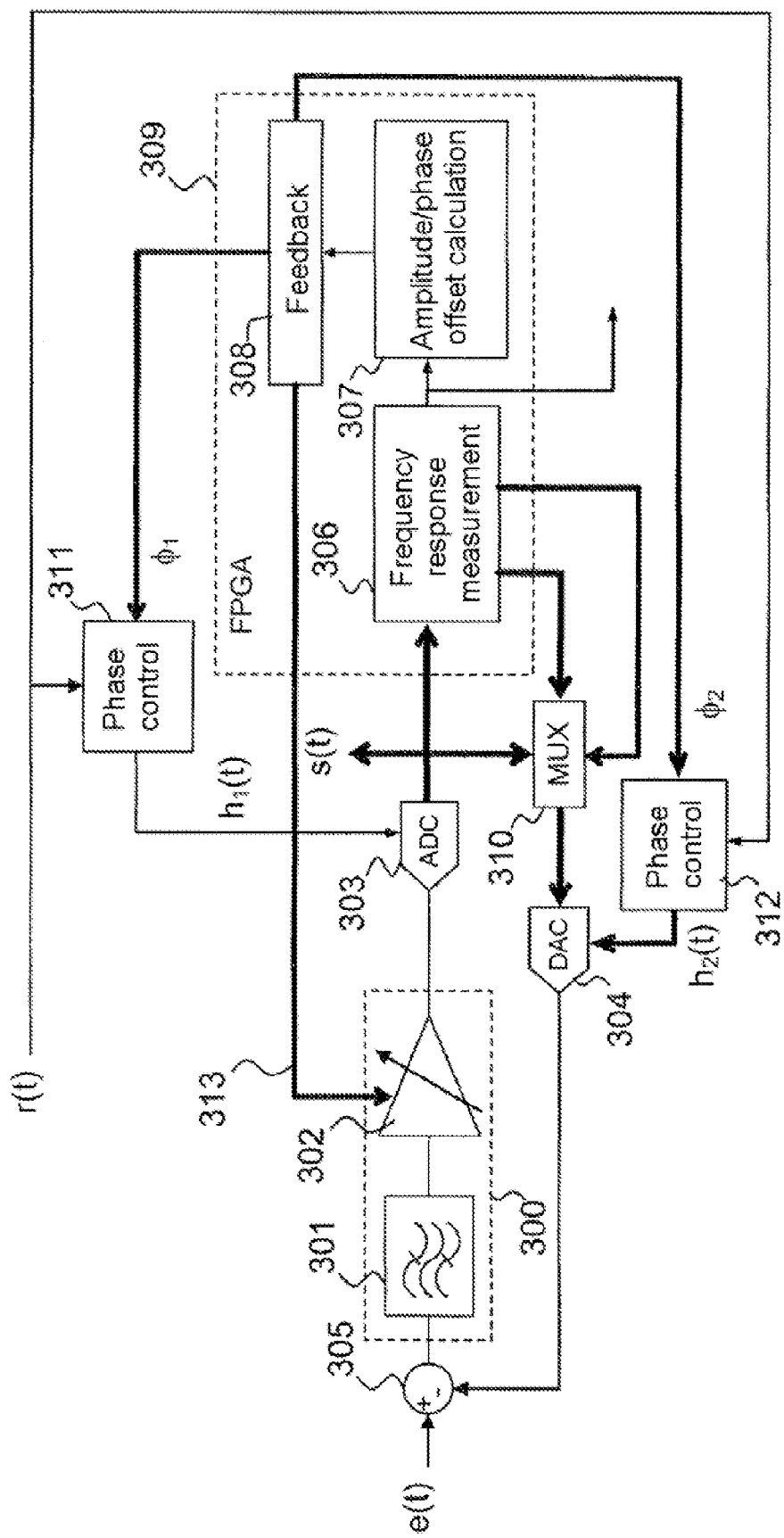
FIG. 3 presents a second variant of a sigma-delta modulator implementing the method according to the invention.

FIG. 3 presents a second variant of a sigma-delta modulator implementing the method according to the invention.

Most of the items of FIG. 2 are used. The modulation loop is composed of an integrator 300 comprising a filter 301 and an amplifier 302, an ADC converter 303, a DAC converter 304 and an adder-subtractor 305.

The operations for measuring the frequency response 306, calculating the amplitude/phase offset 307 and calculating the gain and phase commands by feedback 308 are, for example, implemented within an FPGA type programmable logic device 309. A multiplexer 310 is commanded so as to open the loop and thus carry out, when necessary, a measurement of the open-loop frequency response. The gain of the variable gain amplifier 302 is controlled 313 by the feedback module 308.

The phase offset of the loop can be corrected by adjusting the relative phase between the clock signals $h_1(t)$ and $h_2(t)$ of the two converters ADC 303 and DAC 304 of the loop. The difference with the variant of FIG. 2 lies in the fact that two digital phase-control command values $\phi_1$ and $\phi_2$ are used to adjust the relative phase between the clock signals $h_1(t)$ and $h_2(t)$ of the two converters 303, 304 of the loop. These commands are used, respectively, by two phase-control modules 311, 312 allowing the phase of the clock signals $h_1(t)$ and $h_2(t)$ to be adjusted.

The invention claimed is:

1. A method for correcting amplitude and phase offsets in a sigma-delta modulator comprising a loop including an integrator having a filter and an amplifier, an analog-to-digital converter, a digital-to-analog converter, and an adder-subtractor, said method comprising:
   digitally estimating an open-loop amplitude/phase frequency response of the modulator;
   calculating a phase offset value and an amplitude offset value by comparing the estimated open-loop amplitude/phase response with a reference amplitude/phase frequency response; and
   compensating the phase and amplitude offsets of the loop according to the calculated phase and amplitude offset values.

2. The method as claimed in claim 1, wherein the amplifier is a variable gain amplifier.

3. The method as claimed in claim 2, wherein the amplitude offset compensation comprises controlling the variable gain amplifier using a command representative of the calculated amplitude offset value.

4. The method as claimed in claim 2, wherein the amplitude offset compensation comprises feedback with integration of error over a defined duration on amplitude offset values calculated over the defined duration to control the variable gain amplifier.

5. The method as claimed in claim 1, wherein:
   the loop comprises a variable attenuator, and
   the amplitude offset compensation comprises controlling said variable attenuator using an attenuation command representative of the calculated amplitude offset value.

6. The method as claimed in claim 1, wherein the phase offset compensation comprises controlling a phase shift between clock signals of the analog-to-digital converter and the digital-to-analog converter of the loop using at least one command representative of the calculated phase offset value.

7. The method as claimed in claim 6, wherein the phase offset compensation comprises feedback with integration of error over a defined duration on phase offset values calculated over the defined duration to generate the at least one command for controlling the phase shift between clock signals of the analog-to-digital converter and the digital-to-analog converter of the loop.

8. A sigma-delta modulator for converting an analog signal into a digital signal, said sigma-delta modulator comprising:
   a loop including an integrator having a filter and an amplifier;
   an analog-to-digital converter;
   a digital-to-analog converter; and
   an adder-subtractor, wherein said sigma-delta modulator is configured to:
      estimate an sigma-delta modulator open-loop amplitude/phase frequency response;
      calculate phase and amplitude offsets by comparing the sigma-delta modulator open-loop estimated amplitude/phase frequency response with a reference amplitude/phase frequency response;
      compensate for the calculated amplitude offsets; and
      compensate for the calculated phase offsets by controlling a phase shift between clock signals of the analog-to-digital converter and the digital-to-analog converter.

9. The sigma-delta modulator as claimed in claim 8, wherein measurement operations to estimate the sigma-delta modulator open-loop amplitude/phase frequency response and the phase and amplitude offset calculations are carried out by an FPGA type programmable logic device.

* * * * *

UNITED STATES PATENT AND TRADEMARK OFFICE
CERTIFICATE OF CORRECTION

PATENT NO.       : 8,614,635 B2
APPLICATION NO. : 13/127041
DATED            : December 24, 2013
INVENTOR(S)      : Jean-Michel Hode It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 174 days.

Signed and Sealed this
Twenty-second Day of September, 2015

Michelle K. Lee
*Director of the United States Patent and Trademark Office*